United States Patent
Godet et al.

(10) Patent No.: US 8,815,720 B2
(45) Date of Patent: Aug. 26, 2014

(54) METHOD OF ETCHING A WORKPIECE

(75) Inventors: Ludovic Godet, Boston, MA (US); Morgan D. Evans, Manchester, MA (US); Chi-Chun Chen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 155 days.

(21) Appl. No.: 13/440,678

(22) Filed: Apr. 5, 2012

(65) Prior Publication Data

US 2012/0276658 A1 Nov. 1, 2012

Related U.S. Application Data

(60) Provisional application No. 61/474,564, filed on Apr. 12, 2011.

(51) Int. Cl.
*H01L 21/302* (2006.01)
*H01L 21/322* (2006.01)

(52) U.S. Cl.
USPC .................. 438/524; 438/705; 438/718

(58) Field of Classification Search
USPC .................. 438/524, 705, 718, FOR. 118; 257/E21.22
See application file for complete search history.

(56) References Cited

U.S. PATENT DOCUMENTS

| | | | |
|---|---|---|---|
| 4,735,920 A * | 4/1988 | Stephani et al. | 438/718 |
| 5,436,174 A * | 7/1995 | Baliga et al. | 438/705 |
| 6,930,030 B2 * | 8/2005 | Rausch et al. | 438/589 |
| 7,807,583 B2 | 10/2010 | Van Aelst et al. | |
| 2002/0096496 A1 * | 7/2002 | Molnar et al. | 216/87 |
| 2010/0252531 A1 | 10/2010 | Godet et al. | |
| 2011/0151610 A1 | 6/2011 | Ramappa et al. | |
| 2011/0309049 A1 | 12/2011 | Papasouliotis et al. | |
| 2012/0098087 A1 * | 4/2012 | Abadeer et al. | 257/507 |
| 2012/0276658 A1 * | 11/2012 | Godet et al. | 438/3 |

FOREIGN PATENT DOCUMENTS

| | | |
|---|---|---|
| EP | 0363099 A1 | 4/1990 |
| EP | 1079424 A1 | 2/2001 |
| FR | 2905516 A1 | 3/2008 |

OTHER PUBLICATIONS

Ladroue et al., Deep GaN Etching by Inductively Coupled Plasma and Induced Surface Defects, J. Vac. Sci. Tech. A, Sep./Oct. 2010, pp. 1226-1233, vol. 28(5), American Vacuum Society.
Yang et al, Fabrication of Mesa Shaped InGaN-Based Light-Emitting Process, J. of Electonic Materials. 2009, pp. 145-152, vol. 38, No. 1.
Qiu et al, Optimization of Inductively Coupled Plasma Deep Etching of GaN and Etching Damage Analysis, Applied Surface Sci., 2011, pp. 2700-2706, vol. 257, Elsevier B.V.

* cited by examiner

*Primary Examiner* — George Fourson, III

(57) ABSTRACT

A workpiece is implanted to a first depth to form a first amorphized region. This amorphized region is then etched to the first depth. After etching, the workpiece is implanted to a second depth to form a second amorphized region below a location of the first amorphized region. The second amorphized region is then etched to the second depth. The implant and etch steps may be repeated until structure is formed to the desired depth. The workpiece may be, for example, a compound semiconductor, such as GaN, a magnetic material, silicon, or other materials.

9 Claims, 5 Drawing Sheets

METHOD OF ETCHING A WORKPIECE

CROSS-REFERENCE TO RELATED APPLICATIONS

This claims priority to the provisional patent application entitled "Defect-Free Etching of a Compound Semiconductor," filed Apr. 12, 2011 and assigned U.S. App. No. 61/474,564, the disclosure of which is hereby incorporated by reference.

FIELD

This invention relates to ion implantation and, more particularly, to ion implantation of a workpiece to improve etching.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

In order for light-emitting diodes (LEDs) to gain more of the lighting market, improvements in efficiency and manufacturing cost may be required. In many processes, etching is used to form mesas between LEDs. This etching step is one area that can be improved. Defects and dislocations in the GaN of an LED create centers for etch rate enhancement or reduction. These centers result in cavities, nano-pillars/nano-columns, roughness, or other etch imperfections. In addition, different crystal orientations result in different etch rates. Furthermore, the etch rate of GaN or other compound semiconductors may be slow or provide paths for leakage in a device.

Ion implantation may be used to amorphize or damage the defects or dislocations of a compound semiconductor, such as GaN, or some other material. The etch rate is affected if the material being etched is amorphized. FIG. 1 is a cross-sectional side view of a GaN workpiece. The workpiece 100 has a GaN layer 116 and substrate 102 composed of sapphire. A mask 103, which may be photoresist or some other hard mask, is disposed on the surface of the GaN layer 116. The distance between the top surface of the GaN layer 116 with the mask 103 to the sapphire substrate 102 may be at least 1 µm, as seen by length 115 in FIG. 1. In another example, the length 115 may be at least 10 µm. Implantation from the surface to the desired depth in GaN layer 116 may be costly and time consuming and require multi-energy implantation as high as 10 MeV and a dose as high as 1E18. This may be too slow or expensive for commercial manufacturing. Lateral straggle also may occur, which could potentially damage the material of the GaN layer 116. Furthermore, point defects and dislocations formed during GaN growth may cause defects at the bottom of any trench that is formed in the GaN layer 116. This may be at least partly due to the lattice mismatch between the GaN layer 116 and the substrate 102, which will be worse closest to the intersection of the GaN layer 116 and substrate 102. What is needed is an improved method of implanting a workpiece to improve etching.

SUMMARY

According to a first aspect of the invention, a method of forming a structure in a workpiece is provided. The method comprises implanting a workpiece to a first depth to form a first amorphized region. The first amorphized region is etched to the first depth. The workpiece is implanted to a second depth to form a second amorphized region below a location of the first amorphized region after the first amorphized region is etched. The second amorphized region is etched to the second depth.

According to a second aspect of the invention, a method of forming a structure in a workpiece is provided. The method comprises alternating between an implant step that forms an amorphized region in a workpiece and an etching step to remove the amorphized region. The implant step and the etching step are each performed at least two times and a structure is formed to a desired depth.

According to a third aspect of the invention, a method of forming a structure in a workpiece is provided. The method comprises placing a workpiece in a chamber. The workpiece is implanted in the chamber to form an amorphized region and etched in the chamber to remove the amorphized region. The implanting and etching is repeated in the chamber until a structure is formed in the workpiece to a desired depth.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with ion implantation of compound semiconductors such as GaN, but these embodiments also may be used with other III/V compound semiconductors, II/VI compound semiconductors, magnetic materials, silicon, dielectrics, metals, combinations thereof, or other materials known to a person skilled in the art. The workpiece may be part of an LED, magnetoresistive random-access memory (MRAM) stack, microelectromechanical systems (MEMS) device, some other multi-layer stack containing multiple materials, three-dimensional integrated circuits, optoelectronic devices, multi junction solar cells, or other structures. A beam-line ion implanter, plasma doping ion implanter, flood implanter, system that modifies a plasma sheath, or other ion implantation system known to those skilled in the art may be used in the embodiments described herein. A cluster tool of multiple chambers may be used in one particular embodiment. Thus, the invention is not limited to the specific embodiments described below.

Figure 1:
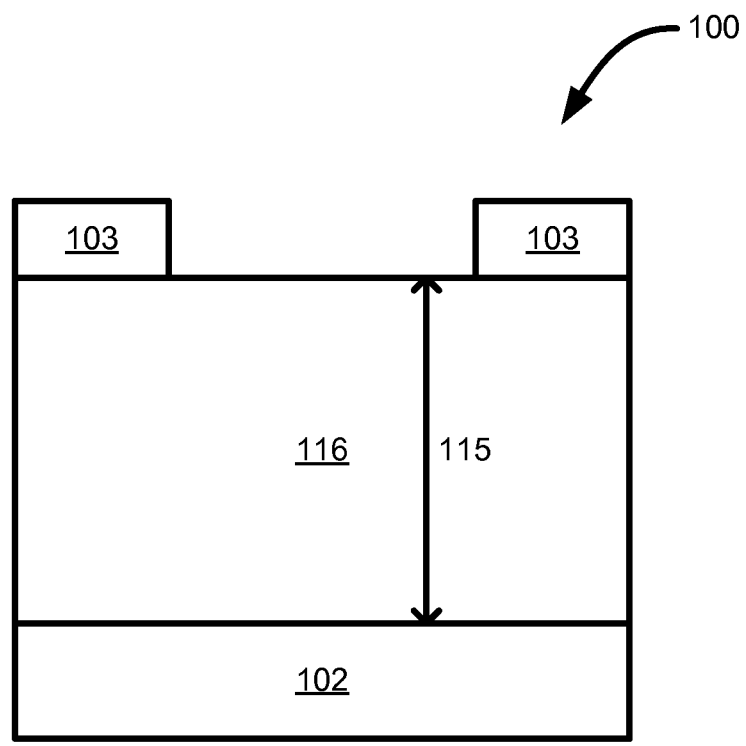
FIG. 1 is a cross-sectional side view of a GaN workpiece.
Figure 2:
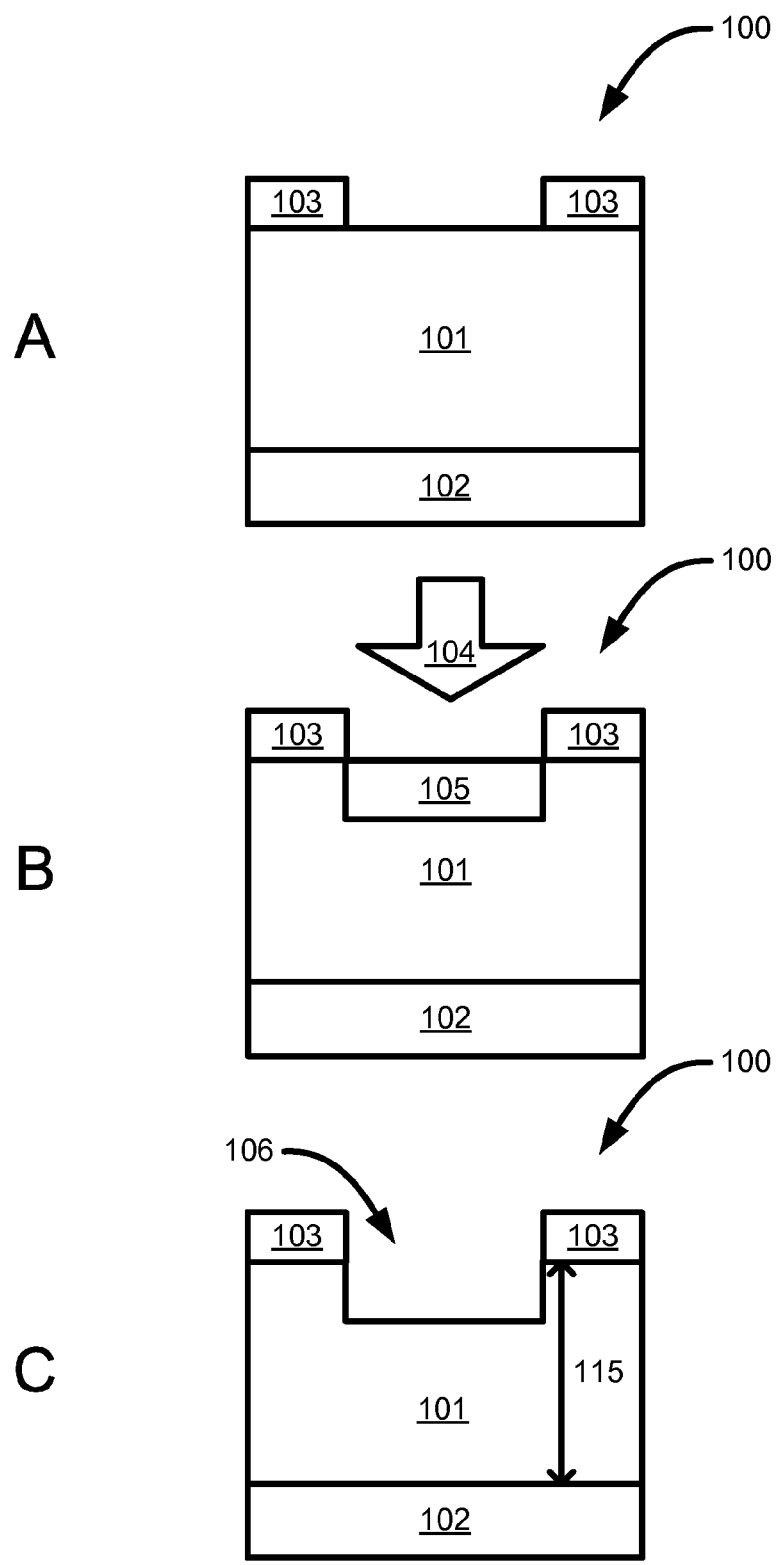
FIGS. 2A-2F are cross-sectional side views of a first embodiment of implanting and etching a workpiece.
Figure 2:
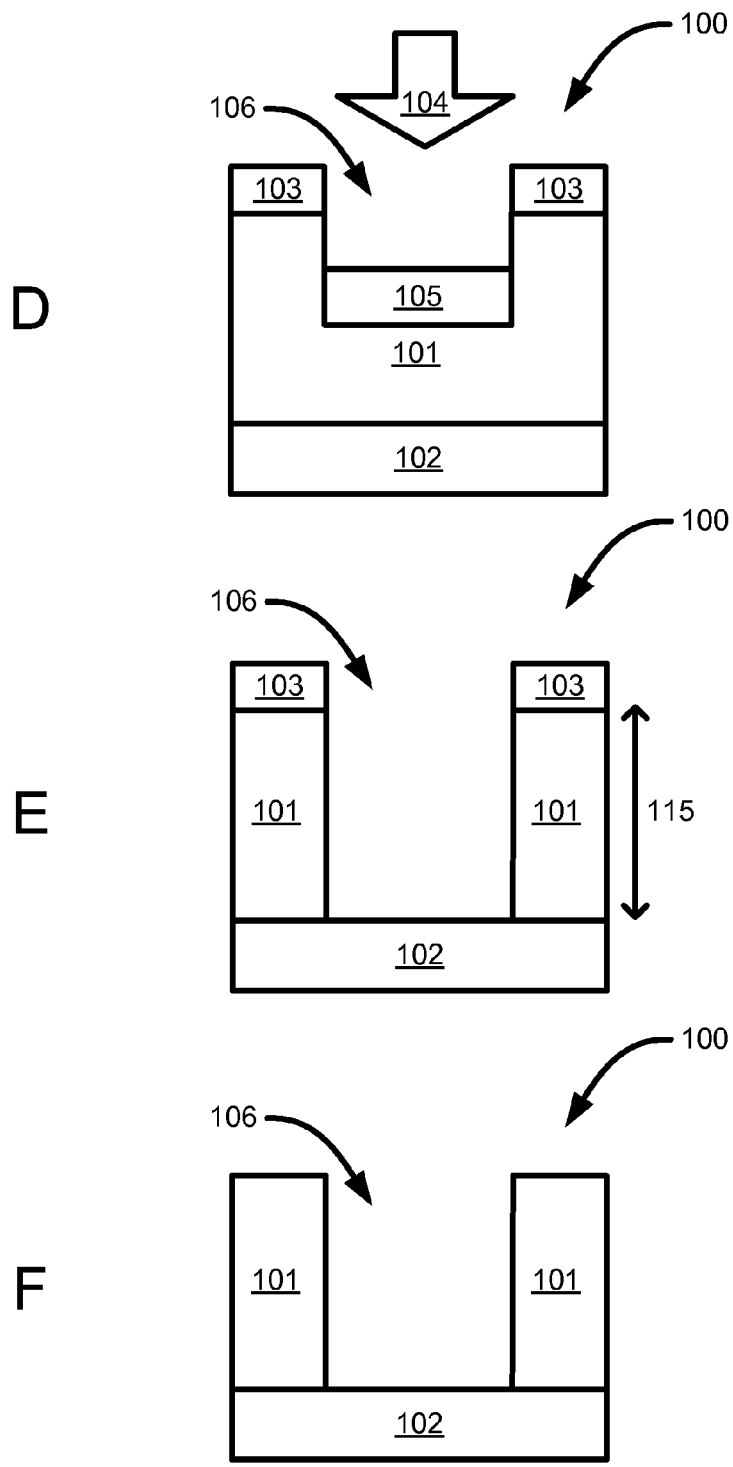

A multi-step implant approach will avoid the drawbacks of other implant and etch methods. FIGS. 2A-2F are cross-sectional side views of a first embodiment of implanting and etching a workpiece. In FIG. 2A, a workpiece 100 is provided with a layer 101, substrate 102, and a mask 103. The substrate 102 may be sapphire and the layer 101 may be GaN in one embodiment, but other materials are possible. The substrate 102 may not be present or used in another embodiment.

In FIG. 2B, ions 104 are implanted through an aperture in the mask 103 to form an amorphized region 105 that extends to a first depth in the layer 101. These ions 104 may be N, but other species may be used.

In FIG. 2C, the amorphized region 105 is etched away to form trench 106. In one instance, bonds of the material in the amorphized region 105 are broken, which increases the efficiency of the etching. This trench 106 is not the length 115 of the layer 101. The amorphized region 105 is etched to approximately the first depth in this instance either because the etching is optimized for an amorphous structure or the etching is configured to stop at a particular time. For example, the etching process may be monitored and stopped when the measured concentration of the ions 104 in the amorphized region 105 decreases below a threshold. In another example, the etching may be optimized to be less effective in crystalline material than amorphous material.

In FIG. 2D, the layer 101 is again implanted with ions 104 to form another amorphized region 105 that extends to a second depth in the layer 101. This implant may be perpendicular to the surface to avoid implanting the sidewalls of the layer 101. This amorphized region 105 is subsequently etched to approximately the second depth. The process is repeated until the trench 106 is the entire length 115 of the layer 101 as illustrated in FIG. 2E. Of course, other depths or lengths are possible. The mask 103 is then removed in FIG. 2F. This leaves mesas that can be used for, in one example, LEDs separated by the trench 106.

In one particular embodiment, each implant has a dose between approximately E15 to E16. Each amorphized region 105 may be approximately 20 nm in height or depth, though other dimensions are possible. The overall number of implant and etch steps depends on the dimensions of the amorphized region 105 and the layer 101. For example, five implant steps may be needed if approximately 20 nm of layer 101 amorphized with each implant and if the layer 101 is approximately 100 nm thick. More implant steps may improve the overall quality because lateral straggle decreases as implant energy decreases. Less sidewall damage may occur due to a lower amorphization energy. The mass of the ions 104 also will affect the lateral straggle. Bigger ions 104 result in a shallower implant and lower dose required to amorphize.

The amorphized region 105 removes both point defects and dislocations in the layer 101. The dislocations, for example, are removed or erased when the layer 101 is amorphized because the lattice is partially or totally destroyed and the dislocations become part of the amorphous material. This reduces the occurrence of defects, cavities, nano-pillars/nano-columns, roughness, or other etch imperfections. The trench 106 also may be more abrupt and less rough than previous methods because amorphizing may prevent lateral etching if the dislocations are near the side of the trench. In one instance, allowing approximately 1 nm amorphization under the mask 103 due to lateral straggle may damage any dislocations near the edge of the trench 106 and reduce the etch species from diffusing inside these dislocations. This leads to better LEDs with better isolation interfaces because, for example, approximately 1 nm of amorphized material may be left on the sidewall under the mask 103. Of course, all amorphized material may be etched in an alternate embodiment. Subsequent steps, such as a wet etch step, may be used to remove any remaining residue or material in the trench 106. Furthermore, the process described herein, while using more process steps, may be faster or less expensive than a single implant step because a single implant to the entire depth of the layer 101 may have a very long duration or be at a very high energy. An abrupt trench 106 will still be formed even if cheaper or lower quality GaN layers 101 are used.

In another particular embodiment, the implanting and etching occurs in a single chamber. The workpiece 100 is placed in the chamber. The workpiece is implanted to form an amorphized region and then etched to remove this amorphized region. The implanting and etching is repeated until a structure or trench is formed with the desired depth. The gas that is ionized during implantation and the gas used for etching may be different and may be purged in between steps. For example, $N_2$ and $Cl_2$ or $BCl_2$ and HCl may be used. If a single plasma is used for implantation and etching, then a halogen such as $Cl_2$ may be mixed with $N_2$, $NH_3$, He, or another noble gas. The bias conditions of the workpiece 100 or plasma chamber or the plasma parameters may be varied to preferentially implant or preferentially etch the workpiece 100 using this single plasma. Vacuum around the workpiece 100 may not be broken during this process. Of course, the workpiece 100 may be moved between two or more chambers either breaking vacuum between chambers or maintaining vacuum between chambers.

An implant or plasma process at low energy also may be used after etching to remove any remaining material on the sidewalls of the trench 106. This may improve performance of the device and may occur in the same chamber as the implant or etching in one instance.

Figure 3:
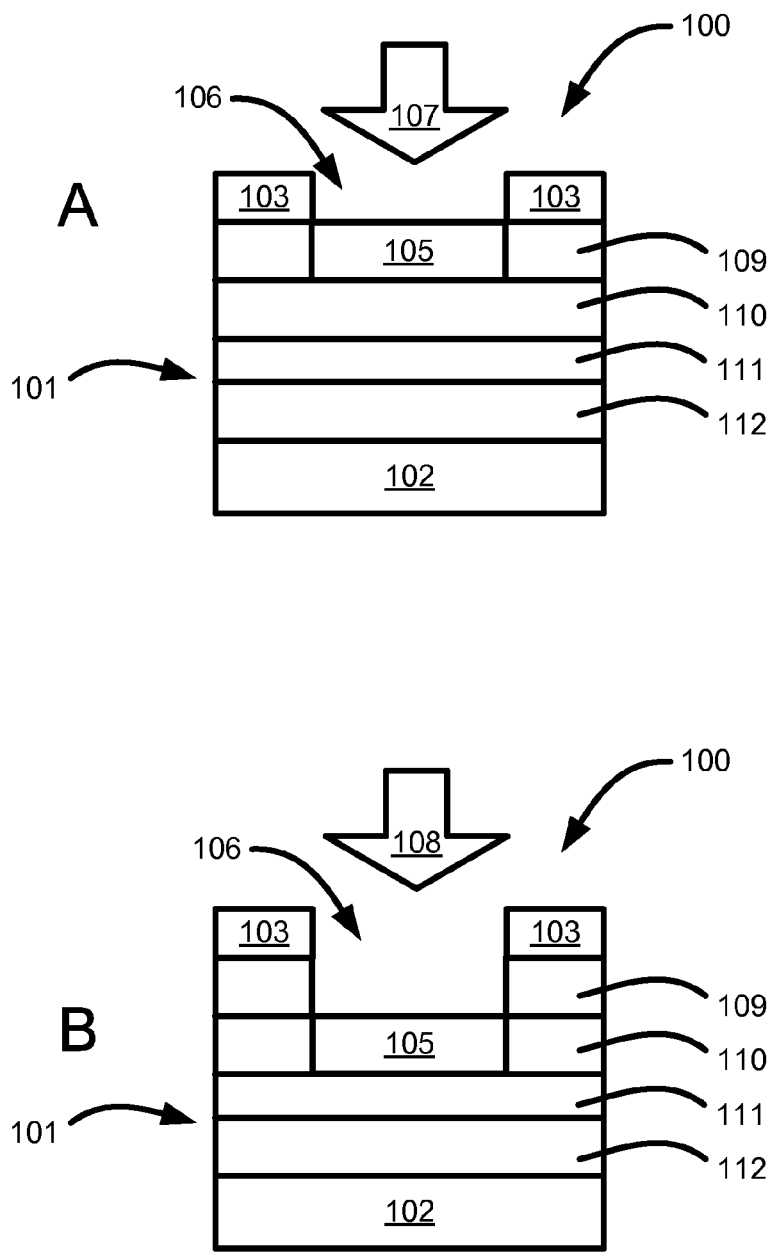
FIGS. 3A-3B are cross-sectional side views of a second embodiment of implanting and etching a workpiece.

FIGS. 3A-3B are cross-sectional side views of a second embodiment of implanting and etching a workpiece. In this embodiment, the layer 101 is actually made of up different layers 109-112. Each of the layers 109-112 may be composed of the same material or may be composed of different materials. The workpiece 100 in this example may be, for example, an MRAM stack, a silicon via, an optoelectronic device, a MEMS device, or a multi-junction solar cell. The ions 107, which may correspond to the ions 104, are used to form the amorphized region 105 in the layer 109. After etching the amorphized region 105 in layer 109, ions 108, which also may correspond to the ions 104, are used to form the amorphized region 105 in the layer 110. The implant energy used to form the amorphized regions 105 in the layer 109 and layer 110 may be different. This may be due to the dimensions of the layer 109 and layer 110 or materials of the layer 109 and layer 110. Some or all of the layers 109-112 may be implanted with different energies.

In another alternate embodiment, the dose or ion species of the ions 108 and ions 107 are changed to form the amorphized regions 105 in the layer 110 and layer 109. This may be due to a difference of materials in the layer 110 and layer 109. Some or all of the layers 109-112 may be implanted with different doses or ion species.

Figure 4:
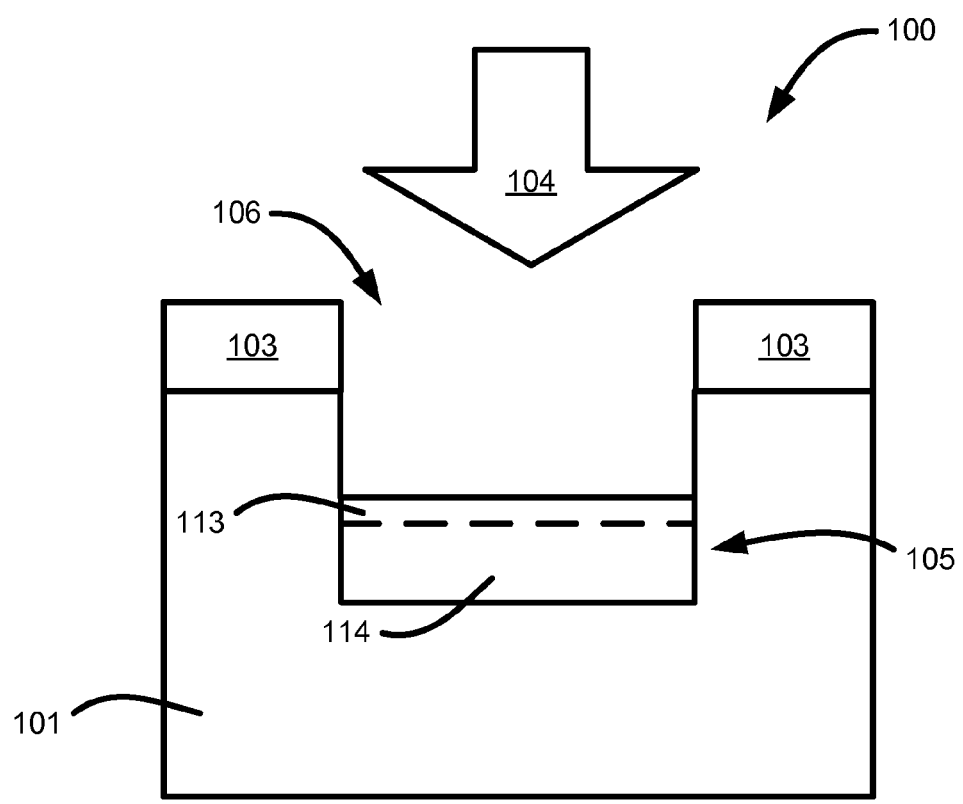
FIG. 4 is a cross-sectional side view of another embodiment of implanting a workpiece.

FIG. 4 is a cross-sectional side view of another embodiment of implanting a workpiece. In this embodiment, the ions 104 are used to form the amorphized region 105 in the layer 101 at two different energies. A first implant energy is used to form the region 114 (below the dotted line) and a second implant energy is used to form the region 113 (above the dotted line). The region 113 and region 114 make up the amorphized region 105. A higher implant energy may be used to form the region 114 and a lower implant energy may be used to form the region 113 closer to the surface. An etch may be used to remove both the region 113 and region 114 of the amorphized region 105. In one specific example, a higher energy, such as approximately 20 kV, may not amorphize the entire amorphized region 105. An approximately 5 kV energy may be used to amorphize or fully amorphize the remainder of the region 113.

While a mask 103 is illustrated, in an alternate embodiment the implantation of ions 104 occurs without a mask 103 on the workpiece 100. A device that focuses ions, shadow or stencil masks disposed above or a distance away from the workpiece 100, or a device that modifies the shape of a plasma sheath all may be used for the selective implants into the workpiece 100. This eliminates the mask 103 application and removal steps and further reduces costs.

In an alternate embodiment, inert species, noble gases, p-type species, or n-type species are used instead of N for the ions 104. He, Ne, Ga, B, P, or As are just some examples and other species known to those skilled in the art also may be used. Different species result in different etch speeds or trench 106 characteristics. For example, implanting B may result in a faster etching rate. In one instance, if silicon in the layer 101 is doped, during etching it may form a volatized molecule. Other species also may affect etch rate, such as by modifying a material property of the material being etched. In another instance, the ions 104 are an inert species mixed with an active etch species such as Cl or another halogen. If an active etch species is used as at least part of the ions 104, then the ions 104 may both amorphize and begin to etch the surface of the amorphized region 105.

In one particular embodiment, different species are used for the ions 104 during different implant steps. For example, a first species is used to amorphize the layer 101 at the beginning of the process, but then a second species is used to amorphize the layer 101 at a slower rate when the etching is closer to the substrate 102 or father from a surface of the layer 101, such as the surface of the layer 101 with the mask 103. This may enable more control of the etching process when needed and prevent unintended damage to the substrate 102. For example, N and He or B and He may be used.

A vertical trench 106 is illustrated herein. However, the trench 106 may be other shapes or dimensions than that illustrated. For example, the trench 106 may be v-shaped. The embodiment described herein may be used to form many different shaped trenches.

The material of the trench 106 sidewalls may be doped or isolated before, during, or after this process. For example, the ions 104 or subsequent steps, such as an implant step, may be used to isolate the walls of the trench 106. A surface peak profile may be formed. In one particular embodiment, multiple angled implants or a single implant may treat the sidewalls of the trench 106 after etching is complete. A bimodal angular distribution may be used for the single implant.

The workpiece 100 may be scanned during implantation. This may enable the entire workpiece 100 to be implanted if the workpiece 100 contains multiple structures or devices where etching is desired. The ions used to form the amorphized regions 105 may be, for example, a ribbon beam, a scanned spot beam, or a focused ion beam. Of course, a plasma doping or plasma immersion ion implant system may be used to treat an entire workpiece 100 without scanning. If scanning is used, the workpiece 100 may be rotated during implantation to enable uniformity of the amorphized regions 105 across the workpiece 100.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a structure in a workpiece comprising:
   implanting a workpiece to a first depth to form a first amorphized region;
   etching said first amorphized region to said first depth;
   implanting a workpiece to a second depth to form a second amorphized region below a location of said first amorphized region after said etching of said first amorphized region; and
   etching said second amorphized region to said second depth, wherein said workpiece in said first amorphized region comprises a first material and said workpiece in said second amorphized region comprises a second material different from said first material.

2. The method of claim 1, further comprising:
   implanting a workpiece to a third depth to form a third amorphized region below a location of said second amorphized region after said etching of said second amorphized region; and
   etching said third amorphized region to said third depth.

3. The method of claim 1, further comprising forming a mask on said workpiece.

4. The method of claim 1, wherein said workpiece comprises a compound semiconductor.

5. The method of claim 1, wherein said workpiece comprises a magnetic material.

6. The method of claim 1, wherein said workpiece comprises silicon.

7. The method of claim 1, wherein said implanting said workpiece to said first depth occurs at a first energy and wherein said implanting said workpiece to said second depth occurs at a second energy different from said first energy.

8. The method of claim 1, wherein one of said implanting to form said first amorphized region or said implanting to form said second amorphized region comprises two implants at two different energies.

9. The method of claim 1, wherein said implanting said workpiece to said first depth occurs using a first species and wherein said implanting said workpiece to said second depth occurs using a second species different from said first species.

* * * * *